United States Patent
Ebihara et al.

[11] 4,011,002
[45] Mar. 8, 1977

[54] ELECTRONIC DEVICE FOR DETECTING THE ENERGIZED STATE OF A LIQUID CRYSTAL DISPLAY CELL

[75] Inventors: Heihachiro Ebihara; Fukuo Sekiya, both of Tokorozawa, Japan

[73] Assignee: Citizen Watch Co., Ltd., Tokyo, Japan

[22] Filed: May 6, 1975

[21] Appl. No.: 574,969

[30] Foreign Application Priority Data
May 16, 1974 Japan .............................. 49-53881

[52] U.S. Cl. .......................... 350/160 LC; 340/336
[51] Int. Cl.$^2$ ...................... G02F 1/18; G08B 5/36; G02F 1/13; G08B 5/22
[58] Field of Search ............ 350/160 LC; 340/336; 58/50 R

[56] References Cited
UNITED STATES PATENTS

| 3,828,548 | 8/1974 | Martin | 58/50 R X |
| 3,912,977 | 10/1975 | Fillmore | 58/50 R X |

OTHER PUBLICATIONS

Lechner, Bernard J. et al. "Liquid Crystal Matrix Displays" Proceedings of the IEEE, vol. 59, No. 11, Nov. 1971 pp. 1566–1579.

*Primary Examiner*—John K. Corbin
*Assistant Examiner*—Rolf Hille
*Attorney, Agent, or Firm*—Sherman & Shalloway

[57] ABSTRACT

An electronic device, having a liquid crystal display cell, includes a driving circuit for changing the state of the liquid crystal cell in accordance with the energized state of the cell thereby preventing the cell from deteriorating due to the energization by a direct current.

7 Claims, 10 Drawing Figures

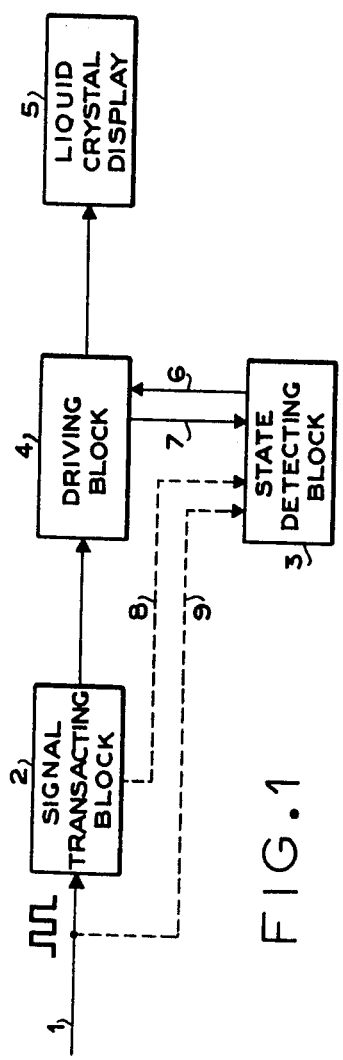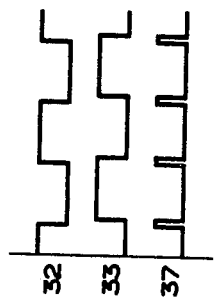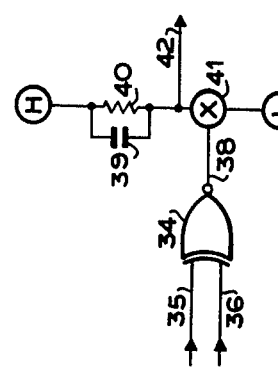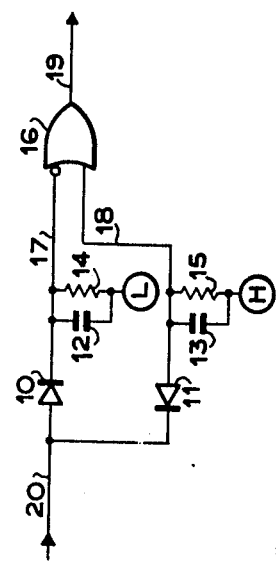

ELECTRONIC DEVICE FOR DETECTING THE ENERGIZED STATE OF A LIQUID CRYSTAL DISPLAY CELL

BACKGROUND OF THE INVENTION

This invention relates to an electronic device which includes one or more liquid crystal display cells.

Heretofore, many electronic devices having one or more liquid crystal display cells such as a timepiece and tabletype electronic calculator have not possessed means for protecting the display cell from energization by a direct current. Therefore, the display cell is often energized by a direct current when an oscillator ceases oscillating or degradation in conductivity occurs. This results in deterioration of the cell.

SUMMARY OF THE INVENTION

An object of the present invention is to provide an electronic device for use, for example, in a timepiece or electronic calculator which is capable of preventing a liquid crystal display cell from being energized by a direct current.

An electronic device according to this invention comprises a detecting circuit which detects whether the liquid crystal display cell is energized by a direct current and includes means for changing the energized state of the display cell in accordance with an output signal from the detecting circuit. This interrupts the voltage impression on the display cell when it is energized by a direct current for preventing deterioration of the display cell.

An example of the state detecting circuit set forth above is one which detects the state in which a signal used for the driving signal and the basis of the driving signal such as a clock pulse train is maintained at the same level or polarity over a predetermined period of time.

Alternatively, a circuit can be used for detecting the driving state of the display cell, which detects the state wherein the voltage levels of two signals supplied to the cell are kept different from each other over the predetermined period of time.

A suitable circuit for changing the energized state of the display cell is one which causes the electrical potentials at all of the electrodes of the cell to be equal with the signal from the state detecting circuit.

The circuit for detecting the state of the liquid crystal cell may include a CR circuit for the measurement of the predetermined time by using the time constant thereof.

Another object of this invention is to provide electrical circuitry which makes it possible to integrate the necessary elements on a single semiconductor substrate. For this purpose a capacitance between the gate and substrate of a MOS-IC is used for forming the CR circuit described above. The leak between P-N junction of an MOS-IC may be utilized for forming the resistance of the CR circuit.

BRIEF DESCRIPTION OF THE DRAWINGS

FIG. 1 is a block diagram showing the construction of the electronic device embodying this invention;

FIGS. 2 and 3a show circuits for detecting the state of a liquid crystal display cell used in the device shown in FIG. 1;

FIG. 3b illustrates wave forms illustrating the operation of the circuit shown in FIG. 3a;

FIGS. 7b and 7c are equivalent circuits of the CR circuits formed in a MOS-IC as shown in FIG. 7a.

Figure 4:
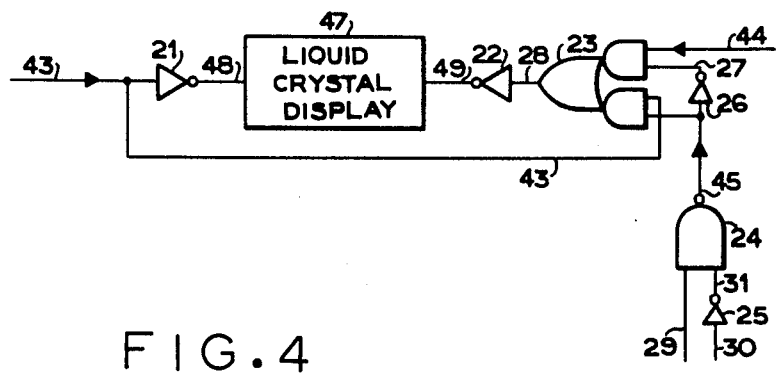
FIGS. 4 and 5 show circuits for changing the driving state of a liquid crystal display cell.

DESCRIPTION OF THE PREFERRED EMBODIMENTS:

Referring now to the drawings, more particularly to FIG. 1: the reference numeral 1 designates a line to which is supplied a clock pulse train such as a time standard signal; 2 designates a signal transacting block such as a frequency divider and a logic circuit; 3 designates a state detecting block for detecting the state of the signal such as a driving signal; a clock pulse train and a signal produced in the block 2; and 4 designates a block for driving a liquid crystal display cell 5 and for changing the energized state in accordance with the signal from the block 3.

The system shown in FIG. 1 is so arranged that a clock pulse train such as a time standard signal appeared on the line 1 is supplied to the block 2 the output signal of which is delivered to the driving block 4. The output signal of the block 4 is delivered to the block 5 as well as to the block 3 via a line 7 and the output signal of the block 3 is supplied to the block 4 via a line 6. The signal supplied to the block 3 is not limited to the output signal from the block 4 but can utilize the output signal supplied through a line 8 or the clock pulse applied through a line 9 connected to the line 1 can be utilized.

In operation of the system shown in FIG. 1, a clock pulse train such as a time standard signal on the line 1 is sent to the block 2 in which the necessary transaction to the input signal such as a measurement of time and a logical operation is performed. The output signals from block 2 are supplied to block 4 and used as a display information signal and a driving signal based on the display signal. To the state detecting block 3 a signal from the block 4 is supplied via the line 7. In the alternative a signal for the basis of the energizing signal from the block 2 is applied via the line 8 or a signal on the line 1 is applied via the line 9. The block 3 acts to detect whether or not the input signal supplied is normal and delivers the detecting signal to the block 4 via the line 6. If the input signal of the block 3 is judged to be normal, the block 4 produces a signal to the block 5 for causing it to display in accordance with the display information signal from the block 2. On the other hand, if the detecting signal from the block 3 via the line 6 indicates any signs of disturbance, the driving signal from the block 4 is changed so as to cease the impression of the voltage to the liquid crystal display cell 5. Thus, according to the system of this invention, the danger of the display cell deteriorating or degrading because of direct current energization can effectively be avoided.

It is noted that, as has been stated hereinbefore, one of the signals on the lines 7, 8 and 9 can be selected as the input signal to the block 3. The signals to be used as the basis of the energizing signal on the line (such as line 8 or line 9) have a higher frequency than that of the driving signal. Accordingly, when such high a frequency signal is selected, a smaller time constant can be taken of a CR circuit in the circuit for detecting the state of the signal, thereby facilitating incorporating the circuit into an IC. While the energizing signal on the line 7, which is in a form similar to the signal actually supplied to the liquid crystal display cell, is selected, the detection of the energized state of the display cell can be performed.

The energization of the liquid crystal display cell is, in general, accomplished by supplying the electrodes of the cell with alternating or periodic signals having phases which are reverse to one another. The cell is driven by a direct current, if the signal supplied ceases to alternate due to any cause. Accordingly, the state, in which the energizing signal or a basic signal assumes a constant potential over the predetermined period of time, can be deemed to be the state in which the display cell is energized by a direct current.

FIG. 2 illustrates a circuit diagram of the state detecting block 3, showing a circuit which can detect the state wherein the potential of the energizing signal or the basic signal thereof is kept constant over the predetermined period of time.

In FIG. 2, the reference numerals 10 and 11 depict diodes, 12 and 13 capacitors, 14 and 15 resistors and 16 a logic gate. The potential on a line 19, which is connected to the output terminal of the logic gate 16, becomes high (hereinafter referred to as H) either when the potential on a line 17 is low (hereinafter referred to as L) or when the potential on a line 18 is H. A line 20 which corresponds to the line 7, 8 or 9 in FIG. 1 is connected to the anode of a diode 10 as well as to the cathode of a diode 11. The cathode of the diode 10 is connected to the input terminal of the logical gate 16 which has an inverting dot and is connected to the line L through a parallel circuit of a capacitor 12 and resistor 14. The anode of the diode 11 is connected to the input terminal of the logic gate 16 which has no inverting dot and is connected to the line H through a parallel circuit consisting of a capacitor 13 and resistor 15. The line 19 corresponds to the line 6 in FIG. 1.

The operation of the circuit shown in FIG. 2 is as follows:

When the potential on the line 20 is H, the capacitor 12 will be charged rapidly by the current flowing through the diode 10, so that the potential on the line 17 becomes H. On the other hand, when the potential on the line 20 changes to L, the potential on the line 17 becomes L since the electric charges stored in the capacitor 12 flow through the resistor 14 to slowly discharge the capacitor. Therefore, under the condition that an alternating signal is supplied through the line 20 and that the time constant of the CR circuit consisting of the capacitor 12 and resistor 14 is sufficiently large in comparison with the period of the periodic signal on the line 20, the potential on the line 17 is always H. On the other hand, when the potential on the line 20 is L, the capacitor 13 is rapidly charged up with the current flowing through the diode 11 and then the potential on the line 18 becomes L. After the potential on the line changes from L to H, the capacitor 13 is slowly discharged through the resistor 15 and the potential on the line 18 becomes H. Accordingly, when the periodic signal is supplied to the line 20, the potential on the line 18 is kept at L, as far as the time constant of the CR circuit comprising the capacitor 13 and resistor 15 are concerned. As clearly understood from the foregoing, when the normal periodic signal having the predetermined wave form is supplied to the line 20, the potential on the line 17 becomes H and on the line 18 L so that the potential on the line 19 which is the output of the logical gate 16 becomes L.

The potential on the line 19 will become H either when the potential on the line 20 is kept at H, or when the potential on the line 20 is held at L, since the potential on the line 18 becomes H in the former case and the potential on the line 17 becomes L in the latter case.

Namely, the potential on the line 19 is kept at L, if the energizing signal supplied to the line 20 has a normal or predetermined wave form and is held at H, if the display cell is energized by a direct current.

In FIG. 3a, there is shown a modified state detecting circuit which detects the state in which the potentials of two signals are kept at different states over the predetermined period of time, the wave forms of said signals being shown in FIG. 3b at 32 and 33. These signals have equal frequencies with predetermined differences in phase so as to have the same numerical potential at each period.

An Exclusive NOR gate (hereinafter referred to as "Ex-NOR gate") is supplied with two signals through lines 35 and 36 which can be considered two energizing signals from the line 7 (FIG. 1). The output signal of the Ex-NOR gate is delivered through a line 38 to a control signal input of an electronic switch 41, one terminal of which is connected to the line H through a parallel circuit comprising a capacitor 39 and resistor 40 and the other terminal of which is connected to the line L. A line 42, connected between the switch 41 and the parallel circuit, corresponds to the line 6 in FIG. 1.

The circuit in FIG. 3a has the following function:

The electronic switch 41 is turned on when the potential on the line 38 becomes H and thereafter the capacitor 39 is rapidly charged via the switch 41, resulting in a change in the potential on the line 42 to L. When the potential on the line 38 changes to L, the switch 41 is cut off and the electric charge stored in the capacitor 39 slowly flows through the resistor 40. Consequently, the potential on the line 42 slowly goes to H. Accordingly, a periodic signal appears on the line 38, while the potential on the line 42 always becomes L if the time constant of the CR circuit comprising the capacitor 39 and resistor 40 is sufficiently large in comparison with the period of the periodic signal on the line 38. If the lines 35 and 36 are supplied with the signals as shown in FIG. 3b at 32 and 33, respectively, the potential on the line 42 is always kept at L, since the signal as shown in FIG. 3b at 37 appears on the line 38. On the contrary, when the potentials of the signals applied to the lines 35 and 36 are not equal to each other over the predetermined period of time, the potential on the line 38 is held at H, which shows the state in which the liquid crystal display cell is driven by a direct current.

Although a current flows from the line H to L through the resistor 40 when the electronic switch 41 is turned on, it is possible to restrict the power consumption to a relatively low level by selecting a condition in which the duty ratio of the signal 37 in FIG. 3b is kept low and in which the resistance of the resistor 40 is as large as possible.

FIG. 4 illustrates preferable circuitry for part of the driving block 4 and the liquid crystal display cell 47 driven by the block. To the input terminal of a NAND gate 24 is connected the output terminal of an inverter 25. The output terminal 31 of the NAND gate 24 is connected to the input terminal of an inverter 26 and one input terminal of an AND-OR gate 23. The other input terminal 27 of the AND-OR gate 23 is connected to the output terminal of the inverter 26. Also, the input terminal of an inverter 21 is connected via line 43 to an input of the AND-OR gate 23, the other input of the AND-OR gate is connected to the output of the NAND gate 24. The output of the AND-OR gate 23 is connected to the input of an inverter 22, and the output of the inverter 22 is connected to one of the electrodes of the liquid crystal display cell 47. The output of the inverter 21 is connected to the other electrode of the cell 47.

The operation of the circuit shown in FIG. 4 is as follows:

The driving or energizing signals are supplied through lines 43 and 44. In general, the phases of the signals to lines 43 and 44 are opposite to one another. However, the signals (some wave forms of which are shown in FIG. 3b) can be utilized for the purpose of reducing power consumption. When the potential on the line 45 is L, the potential on the line 27 becomes H and the AND-OR gate 23 passes the signal on the line 44 through. At this time an alternating voltage is impressed on the display cell 47 to energize it, because the reversed signal of the signal on the line 43 appears on the line 48 and the reversed signal of the signal on the line 44 appears on the line 49.

On the other hand, when the potential on the line 45 is H, the AND-OR gate conveys the signal on the line 43 to the line 28 because the potential on the line 27 is L. Since the reversed signal of the signal on the line 43 appears on the lines 48 and 49, no voltage is impressed to the display cell 47, resulting in ceasing energization of the display cell.

To the line 29 is supplied the display information signal from the signal transacting block 2 (FIG. 1) and the line 30 is supplied with the detecting signal which shows the state of energization of the cell. Thus, the line 6 in FIG. 1, the line 19 in FIG. 2 or the line 42 in FIG. 3 is connected. The potential of the display information signal on the line 29 is H when the display cell is to be energized and is L when the cell is to be deenergized. The display cell is energized when the potential on the line 29 is H and, therefore, the line 45 is at L, while the cell is deenergized when the line 29 is at L and the line 45 is at H.

When the unusual or abnormal state is detected in the driving signal, the potential on the line 30 becomes H. As a result, the potential on the line 45 becomes H regardless of the potential on the line 29, because the potential on the line 31 becomes L, so that no voltage is impressed to the display cell to deenergize it.

In accordance with this invention, any deterioration of the liquid crystal display cell would effectively be avoided, because the voltage impression to the cell ceases when the cell is energized by a direct current owing to the unusual or abnormal state in the driving signal.

Figure 5:
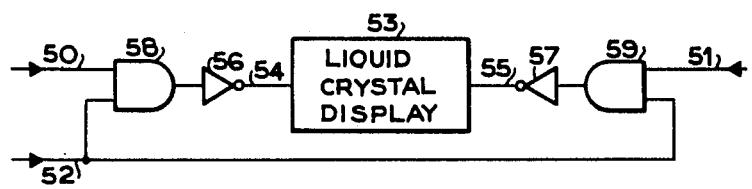

A further modification of the driving block 4 is shown in FIG. 5 which is so arranged so that the input terminal of an AND gate 58 is connected to the input terminal of an AND gate 59, and the output terminal of the AND gate 58 is connected to the input terminal of an inverter 56. The output terminal of the second AND gate 59 is connected to the input of the inverter 57. The output of the inverter 56 is connected to one electrode of a liquid crystal display cell 53, and the output terminal of the inverter 57 is connected to the other electrode of the cell.

The following is a description on the operation of the circuit shown in FIG. 5.

The driving signal is supplied to the AND gate 58 through a line 50 and another driving signal selected in accordance with the display information signal is delivered to the AND gate 59. Also, the reversed signal of the state detecting signal is supplied to the AND gates 57 and 58 through a line 52. When the driving signal is normal, the potential on the line 52 is H. In this state, the reversed signal of the signal on the line 50 appears on the line 54 and the reversed signal of the signal on the line 51 appears on the line 55, so that the display cell 53 is energized to display in accordance with the display information signal. On the contrary, if the driving signal is unusual or abnormal, then the potential on the line becomes L, and the output of the AND gates 58 and 59 becomes L, regardless of the potential on the lines 50 and 51. Accordingly, the potential on the lines 54 and 55 becomes H and the liquid crystal display cell is released from impression of voltage.

Figure 6:
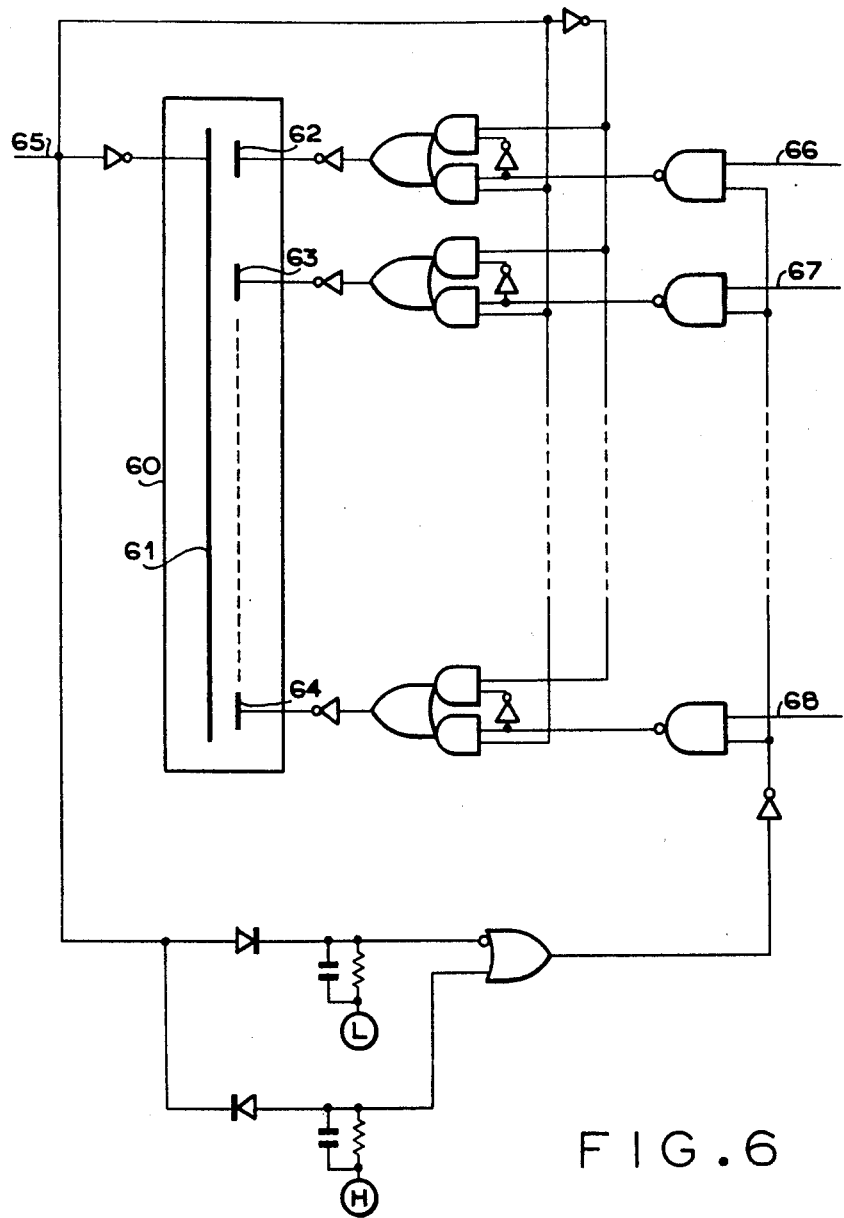
FIG. 6 shows a connection between the circuits shown in FIGS. 2 and 4.

FIG. 6 shows a combined circuit diagram of the circuits shown in FIGS. 2 and 4.

The driving signal, in the circuit in FIG. 6, is supplied to a line 65 and the display information signals for each segment of the display cell 60 are supplied to lines 66, 67 and 68. The reference numeral 61 denotes a common electrode of the cell 60, and 62, 63 and 64 depict segment electrodes, respectively. The operation of the portions circuit of FIG. 6 is similar to that of the circuits as shown in FIGS. 2 and 4.

Figure 7A:
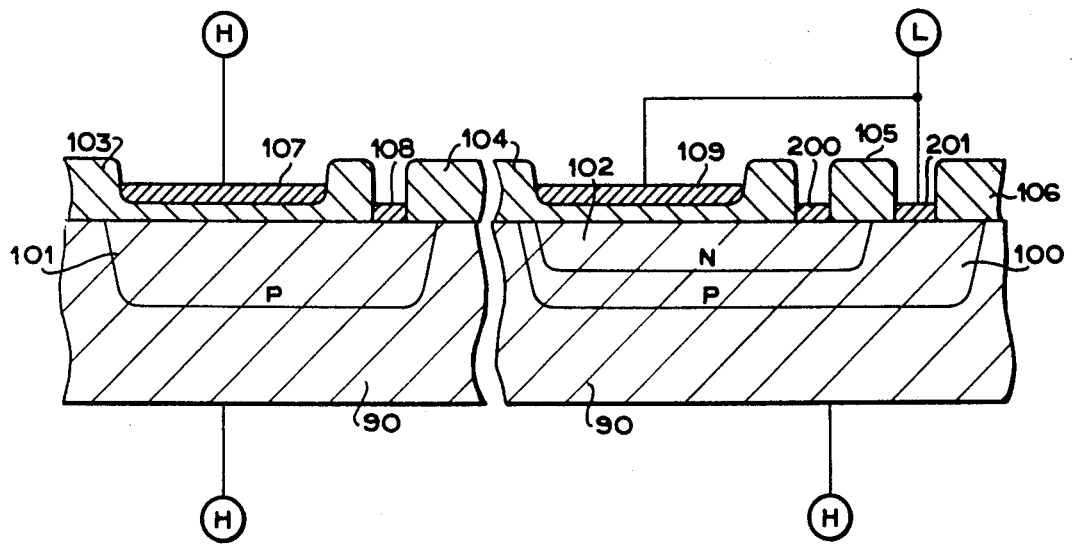
FIG. 7a is a schematic cross section showing a CR circuit formed in a MOS-IC substrate.

FIG. 7a schematically illustrates a construction of an IC having a CR circuit as shown in FIGS. 2 and 3, in which the reference numeral 90 depicts an N-type semiconductor substrate, 100 and 101 a P-type region formed in the substrate, respectively, 102 an N-type region formed in the P-type region, 103, 104, 105 and 106 an oxide film, respectively, 107, 108, 109, 200 and 201 an electrode, respectively, the electrodes 107 and 109 corresponding to the gates of a Metal-Oxide Semiconductor IC.

Figure 7B:
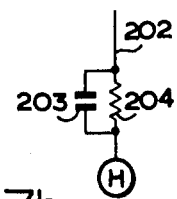
Figure 7C:
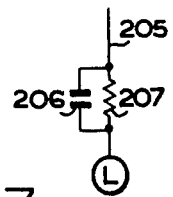

FIGS. 7b and 7c are equivalent circuits of the CR circuits of the IC shown in FIG. 7a. In FIG. 7a there is a capacitance between the gate 107 and P-type region 101 and between the gate 109 and N-type region 102. A leak will occur between the P-type region 101 and N-type region 90 and between the N-type region 102 and P-type region 100 in the reverse direction of the P-N junction, with the predetermined resistance. Accordingly, by connecting the gate 107 and substrate 90 to the line H and the gate 109 and electrode 201 in the P-type region 100 to the line L, the electrode 108 acts as a line 202, a capacitance between the gate 107 and P-type region 101 acts as a capacitor 203; a resistance owing to the leak in the reverse direction between the P-type region 101 and substrate 90 acts as a resistor 204; the electrode 200 in the N-type region acts as a line 205; a capacitance between the gate 109 and N-type region 102 acts as a capacitor 206; a resistance owing to the leak in the reverse direction between the N-type region 102 and P-type region 100 acts as a resistor 207. A CR circuit is thereby formed in the MOS-IC which can be utilized as the CR circuit shown in FIGS. 2 and 3a.

As clearly understood from the foregoing description, the driving circuit, which is free from any danger of driving a liquid crystal display cell by a direct current, can be formed in a semiconductor substrate together with another circuit such as a frequency divider and logic circuit. Of course, the system of this invention is useful for driving an element which must be driven by an alternating current so as to avoid the deterioration or degradation of the element and the resulting increase in the power consumption when the element is driven by direct current.

What is claimed is:

1. An electronic device comprising:
   a logic circuit for producing an alternating current signal,
   a liquid crystal display cell,
   a driving circuit for supplying a driving signal to said display cell in accordance with the output signal from said logic circuit,
   a detecting circuit for monitoring the energized state of said display cell, said detecting circuit producing an output when the display cell is energized by direct current, and
   means for changing the energized state of said display cell to a deenergized state of said display cell in accordance with the output signal from said detecting circuit.

2. An electronic device, defined in claim 1, wherein said detecting circuit generates an output, when the potential of the driving signal remains constant over a predetermined period of time.

3. An electronic device, as defined in claim 1, wherein the driving circuit supplies two driving signals to said display cell and wherein said detecting circuit generates the output when the two driving signals supplied to said display cell are different in potential from one another over a predetermined period of time.

4. An electronic device as defined in claim 1 wherein said driving circuit includes means for equalizing the potential at each of the electrodes of said display cell in accordance with the output from said detecting circuit.

5. An electronic device, as defined in claim 1, wherein said detecting circuit includes logic circuitry and a CR circuit, wherein said CR circuit changes the state of the logic circuitry when direct current occurs.

6. An electronic device, as defined in claim 5, wherein the capacitor of said CR circuit is formed by a capacitance between the gate and substrate of a Metal Oxide Semiconductor integrated circuit.

7. An electronic device as defined in claim 5 wherein a resistance due to the leak between P-N junction of a Metal Oxide Semiconductor IC is used as a resistance in said CR circuit.

* * * * *